(12) United States Patent
Matsunaga et al.

(10) Patent No.: US 6,229,321 B1
(45) Date of Patent: May 8, 2001

(54) PROCESS FOR MANUFACTURING HIGH FREQUENCY MULTICHIP MODULE ENABLING INDEPENDENT TEST OF BARE CHIP

(75) Inventors: Kouji Matsunaga; Hirobumi Inoue; Masao Tanehashi; Masahiko Nikaidou; Toru Taura, all of Tokyo; Yuuichi Yamagishi; Satoshi Hayakawa, both of Kanagawa, all of (JP)

(73) Assignees: NEC Corporation; Anritsu Corporation, both of (JP)

( * ) Notice: Subject to any disclaimer, the term of this patent is extended or adjusted under 35 U.S.C. 154(b) by 0 days.

(21) Appl. No.: 09/238,268

(22) Filed: Jan. 27, 1999

(30) Foreign Application Priority Data

Jan. 27, 1998 (JP) .................................. 10-013964

(51) Int. Cl.[7] .................................................. G01R 31/02
(52) U.S. Cl. ........................................... 324/754; 324/762
(58) Field of Search ..................................... 324/754, 762, 324/72.5, 158.1, 755; 333/246, 248; 439/482

(56) References Cited

U.S. PATENT DOCUMENTS

| | | | |
|---|---|---|---|
| 5,041,782 | * | 8/1991 | Marzan .................................. 324/754 |
| 5,486,770 | * | 1/1996 | Johnson ................................ 324/754 |
| 5,506,515 | * | 4/1996 | Godshalk et al. .................... 324/762 |

* cited by examiner

Primary Examiner—Safet Metjahic
Assistant Examiner—Minh Tang
(74) Attorney, Agent, or Firm—Ostrolenk, Faber, Gerb, & Soffen, LLP (57) ABSTRACT

A process for manufacturing a high frequency multichip module includes a reception inspection step which includes steps of preparing a vertical-type probe, setting the high frequency bare chip on a device stage, and measuring high frequency characteristics of the high frequency bare chip using the vertical-type probe. The prepared vertical-type probe has a center conductor and ground conductors arranged at both sides of the tip portion of the center conductor in the vertical direction in which the probe is pressed to electrodes of the high frequency bare chip. The high frequency bare chip has a ground electrode disposed at the opposite side of the chip from the signal electrodes on the upper surface of a device stage. Then, only a good product is fed to the next step. After the reception inspection, the process goes to a component mounting step. Preferably, the process goes to the next step when the high frequency multichip modules passes at least on of a performance test and visual inspection after the component mounting step.

9 Claims, 12 Drawing Sheets

PROCESS FOR MANUFACTURING HIGH FREQUENCY MULTICHIP MODULE ENABLING INDEPENDENT TEST OF BARE CHIP

BACKGROUND OF THE INVENTION

The present invention relates to a process for manufacturing a high frequency multichip module that includes a high frequency bare chip mounted on a substrate. The bare chip has a ground electrode disposed at the opposite side to the signal electrodes. More particularly, the present invention relates to a process for manufacturing a high frequency multichip module, which can omit a performance test of the small-sized high frequency bare chip after mounting the bare chip and other components on the substrate.

Figure 1:
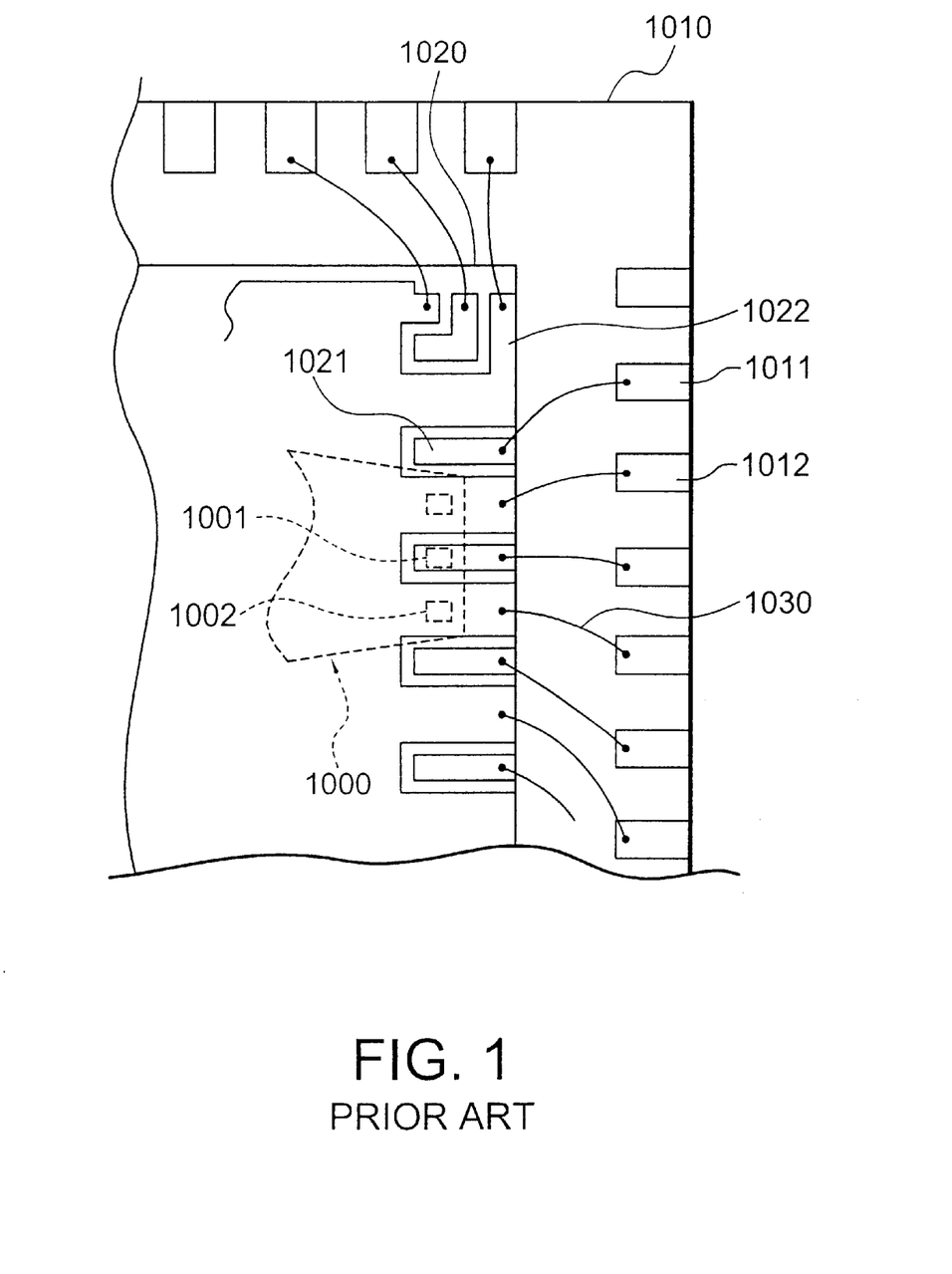
FIG. 1 is an enlarged top view of an example of conventional bare chip mounting.

Conventionally, such a bare chip used for manufacturing a high frequency multichip module is mounted on a substrate 1010 as shown in a top view of FIG. 1. On the substrate 1010, signal electrodes 1011 and ground electrodes 1012 are arranged alternately on the same plane. The coplanar type bare chip 1020 also has signal electrodes 1021 and ground electrodes 1022 arranged alternately on the same plane of the coplanar type bare chip 1020, corresponding to the signal electrodes 1011 and ground electrodes 1012. Each of the signal electrodes 1021 and ground electrodes 1022 is connected to the corresponding signal electrode 1011 or ground electrode 1012 by bonding wire 1030.

In order to measure high frequency characteristics of such a coplanar-type bare chip 1020 by a coplanar-type probe 1000, it was a precondition that the signal electrodes 1021 and the ground electrodes 1022 of the coplanar-type bare chip 1020 are arranged on the same plane as illustrated. And the coplanar type probe 1000 has a center conductor tip portion 1001 that is pressed to the signal electrode 1021 and ground conductor tip portions 1002 that are pressed to the ground electrodes 1022. Therefore, the center conductor tip portion 1001 and the ground conductor tip portions 1002 should be arranged on the same plane that is perpendicular to the pressing direction, and as the coplanar-type bare chip 1020.

Figure 2:
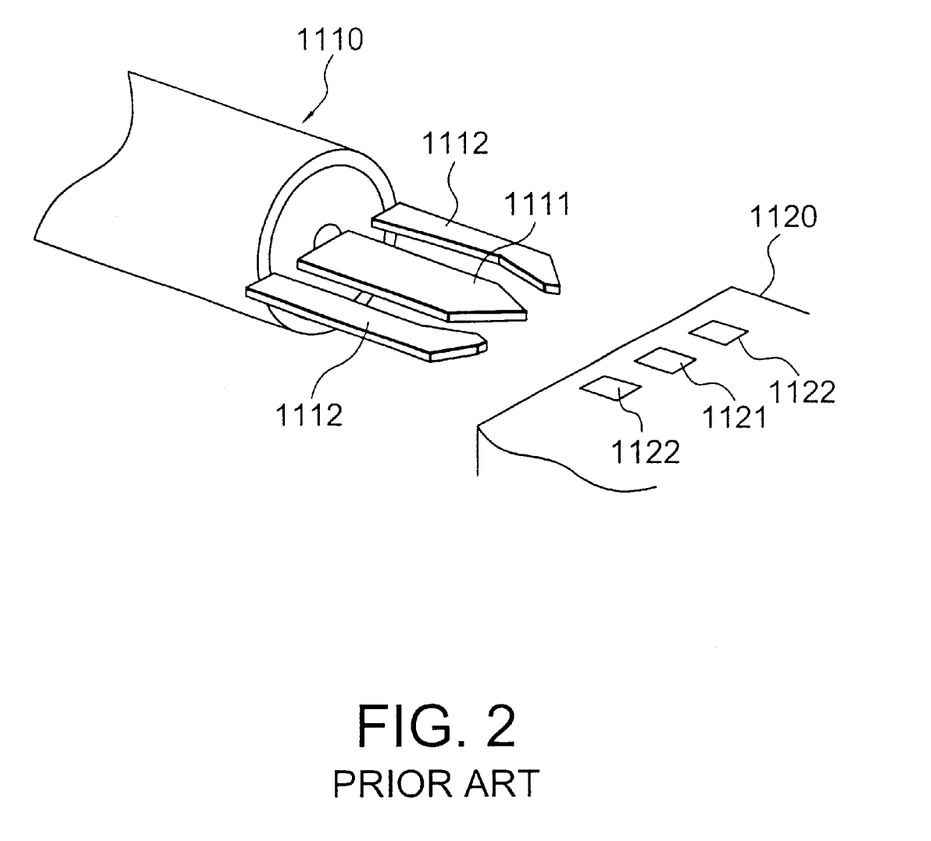
FIG. 2 is a perspective view of an example of a conventional probe and a bare chip.

As illustrated in FIG. 2, a horizontal-type probe or the coplanar-type probe 1110 has conductor tip portions horizontally arranged. The conductor tip portions are a center conductor tip portion 1111 having a flat spring shape and ground conductor tip portions 1112 disposed at the both sides of the center conductor tip portion 1111. And these conductor tip portions 1111 and 1112 are arranged on the same plane. Therefore, the center conductor tip portion 1111 and the ground conductor tip portions 1112 are pressed to the signal electrode 1121 and the ground electrodes 1122 of the coplanar type bare chip 1120 to make electrical contact between each of the conductor tip portions and the corresponding electrode.

As described above, since the coplanar type bare chip 1120 has a signal electrode 1121 and ground electrodes 1122 arranged at both sides of the signal electrode 1121 on the same plane, the area of the coplanar type bare chip 1120 becomes large. For example, if the area of a GaAs-MMIC (monolithic microwave integrated circuit) is large, the number of bare chips that can be made from an expensive GaAs wafer becomes small, so that the cost per chip rises.

When using a peripheral electrode arrangement such as a grid electrode arrangement with bump connection, high cost is still a problem in the same way as described above.

Recently, in order to solve the above-described problem and to obtain a smaller area of the electrodes for external connection capable for high-density mounting, a microstrip-type bare chip is being used. The microstrip-type bare chip has a ground plane on the rear side so as to reduce the ground electrodes on the front side.

Figure 3A:
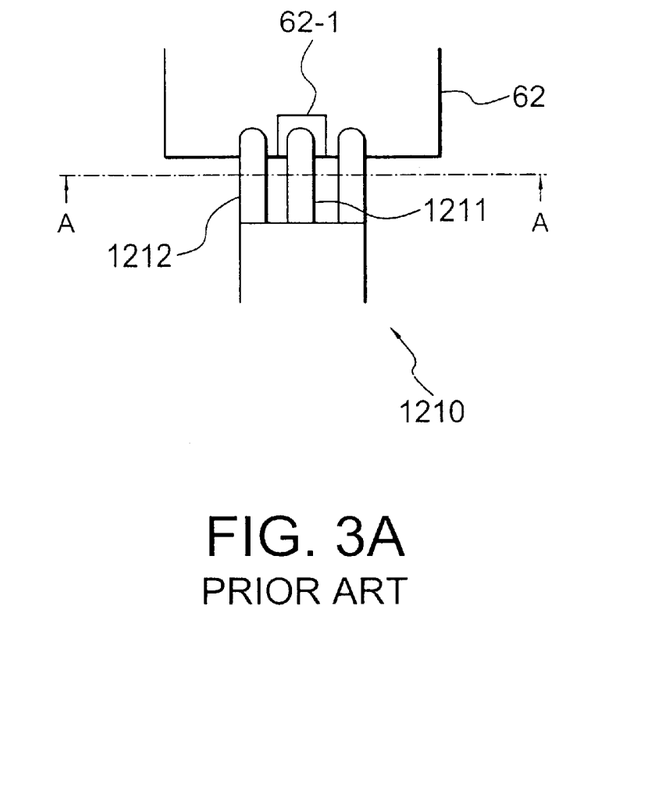
FIG. 3A is a top view of an example of measuring a bare chip with a conventional probe.
Figure 3B:
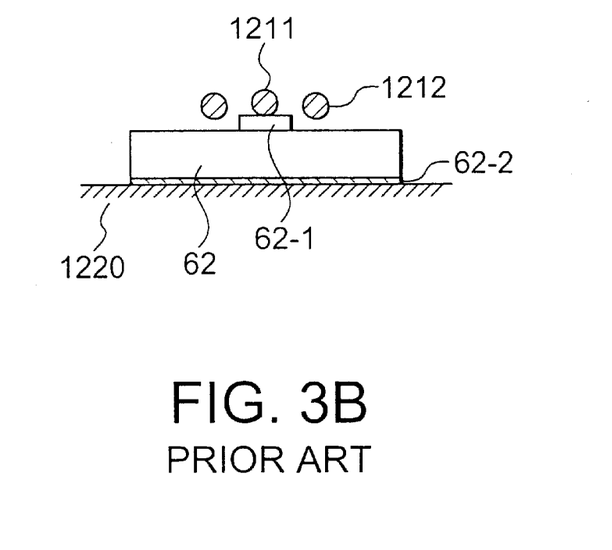
FIG. 3B is a cross section along A—A line in FIG. 3A.

However, as illustrated in FIGS. 3A and 3B, using the above-described coplanar type probe 1210, it is difficult to measure the high frequency characteristics of the microstrip-type bare chip 62, because the microstrip-type bare chip 62 has a signal electrode 62-1 only but no ground electrode on the front surface to be contacted with the ground conductor tip portion 1212 of the coplanar type probe 1210. Instead the microstrip-type bare chip 62 has a ground plane 62-2 at the rear side. As the result, the coplanar type probe 1210 does not contact any ground level when the center conductor tip portion 1211 contacts the signal electrode 62-1 on the front surface of the microstrip type bare chip 62.

Figure 4A:
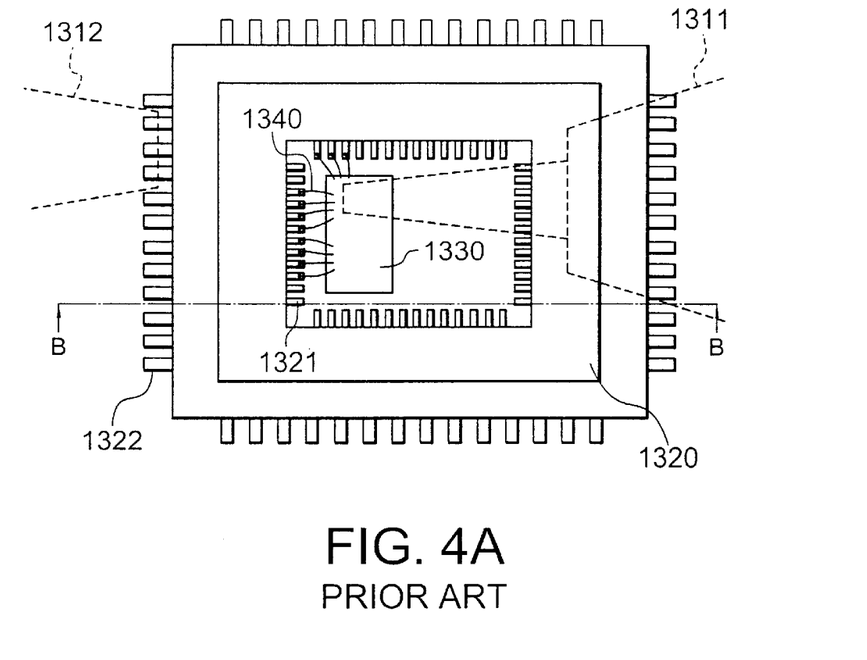
FIG. 4A is an overall top view of the bare chip shown in FIG. 1.
Figure 4B:
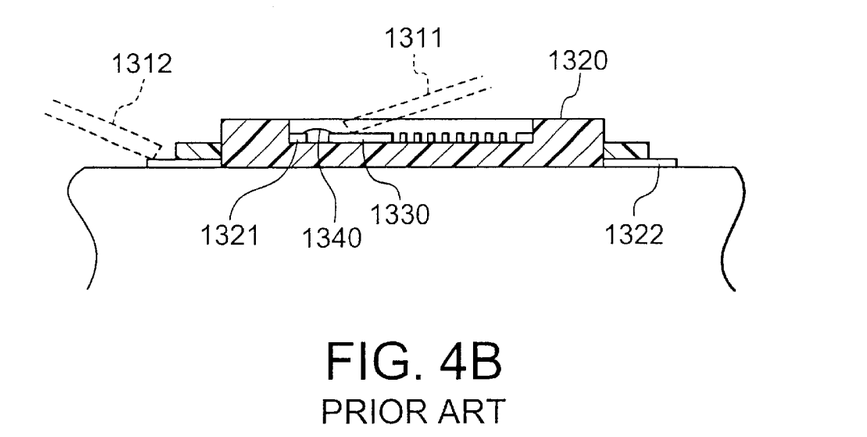
FIG. 4B is a cross section along B—B line in FIG. 4A.

In order to solve the above-described problem, a quad flat package (QFP) is realized, which has a peripheral electrode arrangement as shown in FIGS. 4A and 4B. In this arrangement, inner electrodes are lead out to the periphery of the chip and arranged flatly. This peripheral electrode arrangement enables measurement with the coplanar-type probe 1312 by arranging the signal electrodes and the ground electrodes alternately on outer-substrate electrodes 1322 via inner-substrate electrodes 1321. On the other hand, measurement with the coplanar-type probe 1311 is not possible since the microstrip type bare chip 1330 mounted on the substrate 1320 has a rear ground plane.

Figure 5:
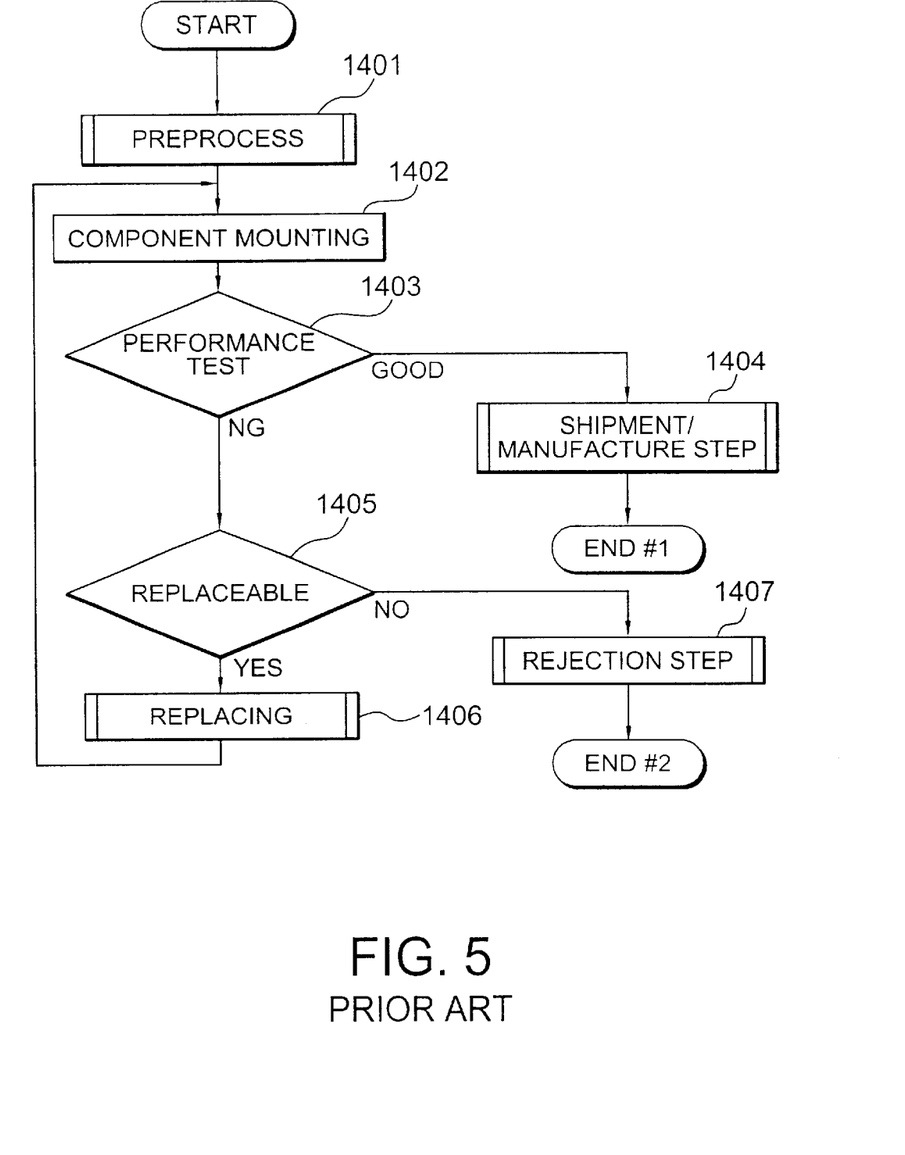
FIG. 5 is a flow chart showing an example of the conventional manufacturing process.

Therefore, as illustrated in FIG. 5, the manufacturing process of the high frequency multichip module illustrated in FIGS. 4A and 4B is realized. At first, a preprocess (step 1401) is performed as a step of component mounting (step 1402) in which the microstrip-type bare chip 1330 and other components are mounted on the substrate 1320, and wire bonding is performed with metal wires 1340. After this step, the coplanar-type probe 1312 is used for the outer-substrate electrodes 1322 so as to measure the high frequency characteristics and to test the performance in a step of a performance test (step 1403). If the mounted component performs well in the performance test ("GOOD" in step 1403), a shipment/manufacture step (step 1404) is performed next in which the product is shipped or the next manufacture step is performed to finish the process (End #1).

If the mounted component is "NG" in the performance test of the above step 1403, it is checked if the mounted component can be replaced with new one in a step of "replaceable" (step 1405). If the replacement is possible by "YES" of step 1405, the mounted component is replaced with a new one in a step of replacing (step 1406) and the process returns to the above-described step 1402 so as to mount and test the performance of the new mounted component.

If the replacement is impossible, in other words, the result of the step 1405 is "NO", this defective product is rejected in the rejection step (step 1407) and the process finishes (End #2).

However, the above-described conventional process for manufacturing the high frequency multichip module has the following problem. Since the conventional probe is coplanar-type, it is difficult to measure the high frequency characteristics of the single bare chip before mounting. Therefore, the performance test of the microstrip-type bare chip should be performed after the mounting of components. In addition, if the result of the performance test is "NG", the defective product should be replaced with a new one. This replacement should be repeated until the result of the performance test is "GOOD", so that the manufacturing time and costs are increased.

SUMMARY OF THE INVENTION

An object of the present invention is to solve the above-described problems. The present invention provides a process for manufacturing a high frequency multichip module which can reduce the manufacturing time and cost by measuring the high frequency characteristics of a single bare chip before mounting. And this single bare chip is compact and is a rear ground chip such as microstrip-type bare chip with a rear ground plane.

In order to attain this object, the measurement of the high frequency characteristics of the high frequency multichip module is performed using a vertical-type probe in the manufacturing process of the present invention. The vertical-type probe has a center conductor and ground conductors arranged at both sides of the center conductor in the vertical direction, which is the direction of pressing the center conductor tip portion to the signal electrode of the microstrip-type bare chip.

On the other hand, the upper surface of a device stage carrying the microstrip-type bare chip is ground surface due to contact with the rear surface of the rear ground chip. Therefore, the vertical-type probe whose center conductor is pressed to the signal electrode of the rear ground chip also presses its ground conductor to the stage upper surface that is the ground surface.

The process for manufacturing a high frequency multichip module according to the present invention comprises a reception inspection step. This reception inspection step includes the steps of preparing the above-described vertical-type probe, setting a high frequency bare chip having a ground electrode disposed at the opposite side to signal electrodes on the upper surface of a device stage, and then measuring high frequency characteristics using the vertical-type probe, before mounting components so as to feed only good products to the next step.

The reception inspection step is performed in the manufacturing process of the high frequency multichip module for mounting the high frequency bare chip having a ground electrode disposed at the opposite side to signal electrodes on the substrate.

More concretely, the reception inspection step includes the steps of device setting, probing, power supplying, characteristic measuring, and rank selecting, performed sequentially after the preprocess and before mounting components.

In the step of setting, the high frequency bare chip is set on the device stage. In the next step of probing, the vertical-type probe is used. The tip portion of the center conductor of the probe is connected to the signal electrode, while the tip portion of the ground conductor is connected to the ground electrode of the high frequency bare chip in the shortest distance, and electric contact is made with a power source electrode of the high frequency bare chip via means for electrically leading out the power source electrode. In the next step of voltage supplying, a predetermined voltage is applied to the power source electrode. In the next step of characteristic measuring, the high frequency characteristics of the high frequency bare chip are measured. In the next step of rank designation, the high frequency bare chip set on the device stage is designation into a rank corresponding to the quality of its product characteristics in accordance with the result of the measurement.

By the above-described process, the component to be mounted is sent to the component mounting step after confirming that the product is good by the high frequency characteristic measurement. Therefore, the probability of producing a defective product is small. In other words, since the small-sized rear ground bare chip is measured independently before mounting, manufacturing time and cost can be reduced.

DESCRIPTION OF THE PREFERRED EMBODIMENTS

Hereinafter, preferred embodiments of the present invention will be described with reference to the accompanying drawings.

Figure 6A:
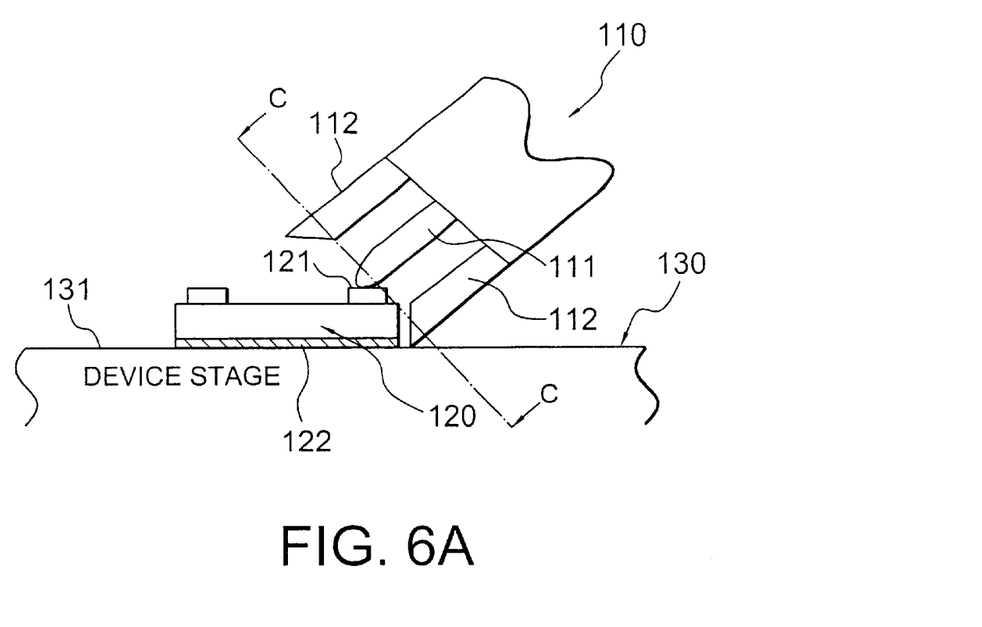
FIG. 6A is a side view showing an example of using a probe according to the present invention.
Figure 6B:
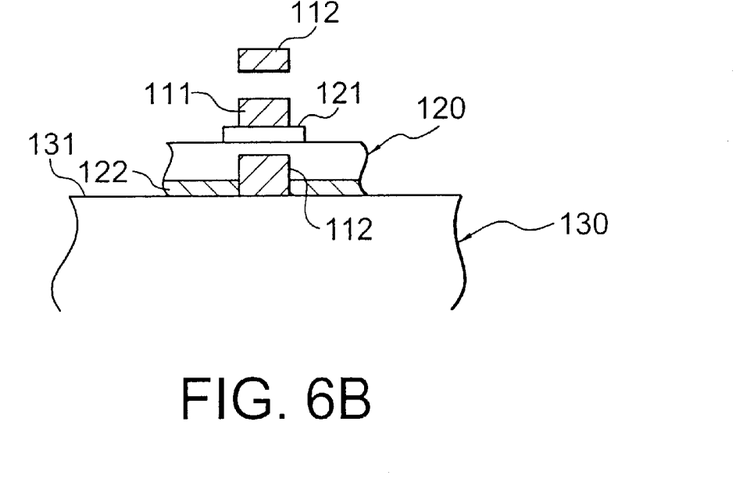
FIG. 6B is a cross section along C—C line in FIG. 6A.

Referring to FIGS. 6A and 6B first, a vertical-type probe used for measuring high frequency characteristics of the high frequency multichip module will be described.

The vertical-type probe 110 has a center conductor 111 disposed at the tip of the probe and ground conductors 112 arranged at both sides of the center conductor 111 in the vertical direction in which the center conductor 111 is pressed to the signal electrode 121 of the microstrip-type bare chip 120.

The microstrip-type bare chip 120 has signal electrodes 121 on the front side and a ground plane 122 at the rear side. Accordingly, the upper stage surface 131 of the device stage 130 which carries the microstrip-type bare chip 120 can contact the rear side of the microstrip-type bare chip 120 along the ground plane 122.

Therefore, the vertical-type probe 110 whose center conductor 111 is pressed to the signal electrode 121 of the microstrip-type bare chip 120 also presses its ground conductor 112 to the stage upper surface that electrically connects the ground plane 122.

Figure 7:
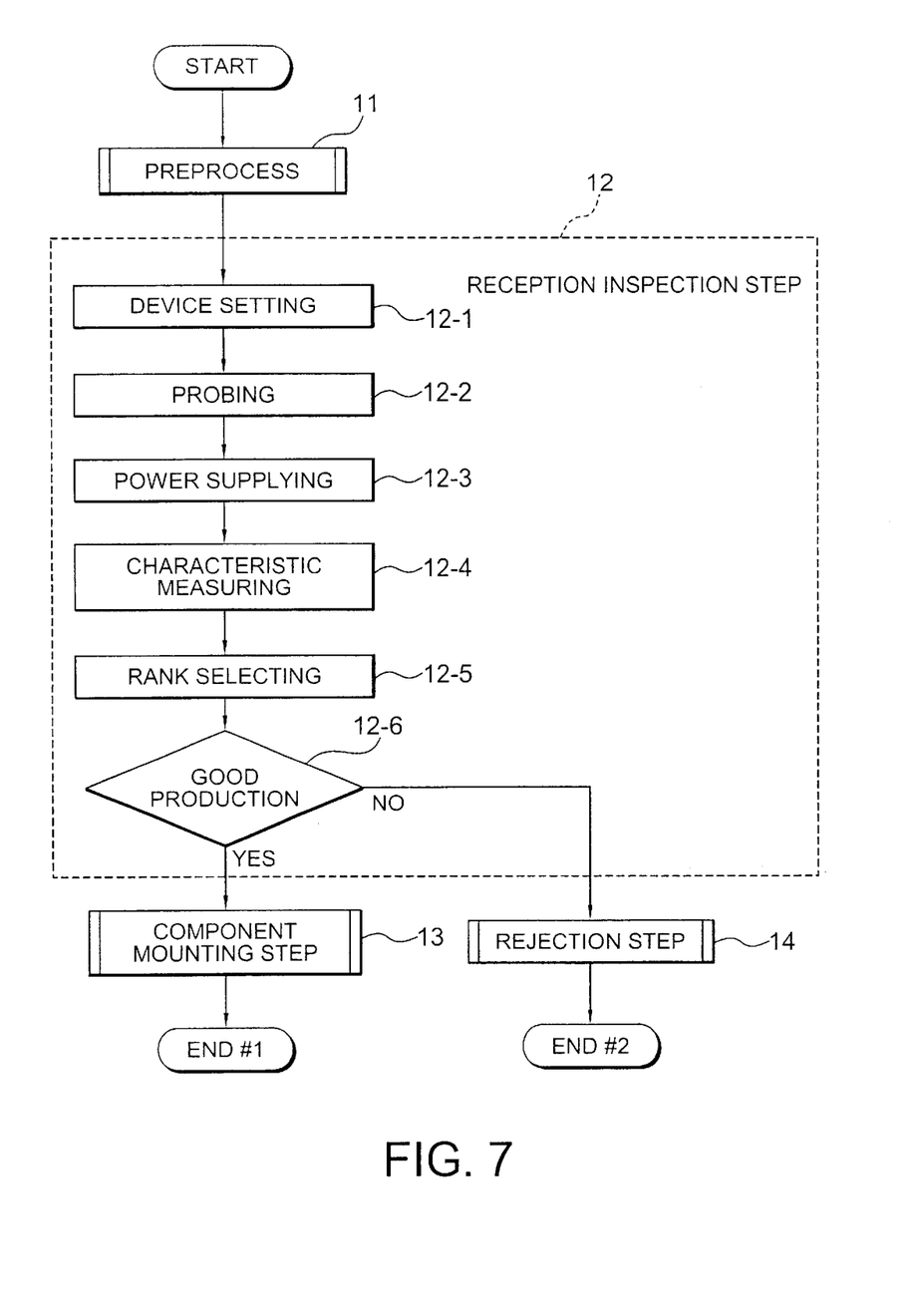
FIG. 7 is a flow chart of a reception test step of a high frequency bare chip in the process for manufacturing a high frequency multichip module according to an embodiment of the present invention.

FIG. 7 is a flow chart showing an example of the present invention.

Referring to FIG. 7, a reception inspecting step of the high frequency bare chip in the manufacturing process of the high frequency multichip module according to the present invention will be described.

In the manufacturing process of the high frequency multichip module illustrated, there is a preprocess (step 11) at first. After this step 11, the reception inspection step (step 12) is performed using the vertical-type probe, and then a component mounting step (step 13) is performed.

This process differs from the conventional process in that the reception inspection step 12 for the high frequency bare chip is performed before the component mounting step 13.

Next, referring to FIGS. 6A, 6B and 7, the reception inspection step 12 of the high frequency bare chip according to the present invention is described.

In the reception inspection step 12 of the high frequency bare chip, the vertical-type probe 110 as illustrated in FIGS. 6A and 6B is used. In this vertical-type probe 110, the ground conductor tip portions 112 are arranged at both sides of the center conductor tip portion 111 in the vertical direction in which the vertical-type probe 110 is pressed to the signal electrode 121 of the microstrip-type bare chip 120 which is a device to be measured.

At first, in the step of device setting (step 12-1), the microstrip-type bare chip 120 is placed on the stage upper surface 131 of the device stage 130 as illustrated in FIGS. 6A and 6B. By this step, the ground plane 122 at the rear side of the microstrip-type bare chip 120 is contacted with and fixed to the stage upper surface 131. As a result, the stage upper surface 131 becomes the ground surface.

In the next step, the vertical-type probe 110 is contacted with the microstrip-type bare chip 120 that is fixed to the stage upper surface 131. Thus, the center conductor 111 of the vertical-type probe 110 is connected to the signal electrode 121 of the microstrip-type bare chip 120, while the ground conductor 112 is connected to the stage upper surface 131 of the device stage 130, as a step of probing (step 12-2). Consequently, the ground conductor 112 is connected to a point on the stage upper surface 131 which is closest to the signal electrode 121 of the microstrip-type bare chip 120.

In the next step, a DC voltage is applied to the power supply electrode as a step of power supplying (step 12-3), and a high frequency signal is inputted and outputted via the vertical-type probe 110 so that the high frequency characteristics are measured as a step of characteristic measuring (step 12-4).

In the next step, designation of the chip into one of a plurality of predetermined ranks is performed in accordance with the result of the high frequency characteristic measurement in the above step 12, as a step of rank selecting (step 12-5). If the product is good ("YES" in step 12-6), the process goes to the component mounting step 13 in which the components are mounted in accordance with the good characteristics of the selected rank to finish the process (End #1). If the product is not good ("NO" in step 12-6), the defective product is rejected in the rejection step 14 to finish the process (End #2).

Figure 8A:
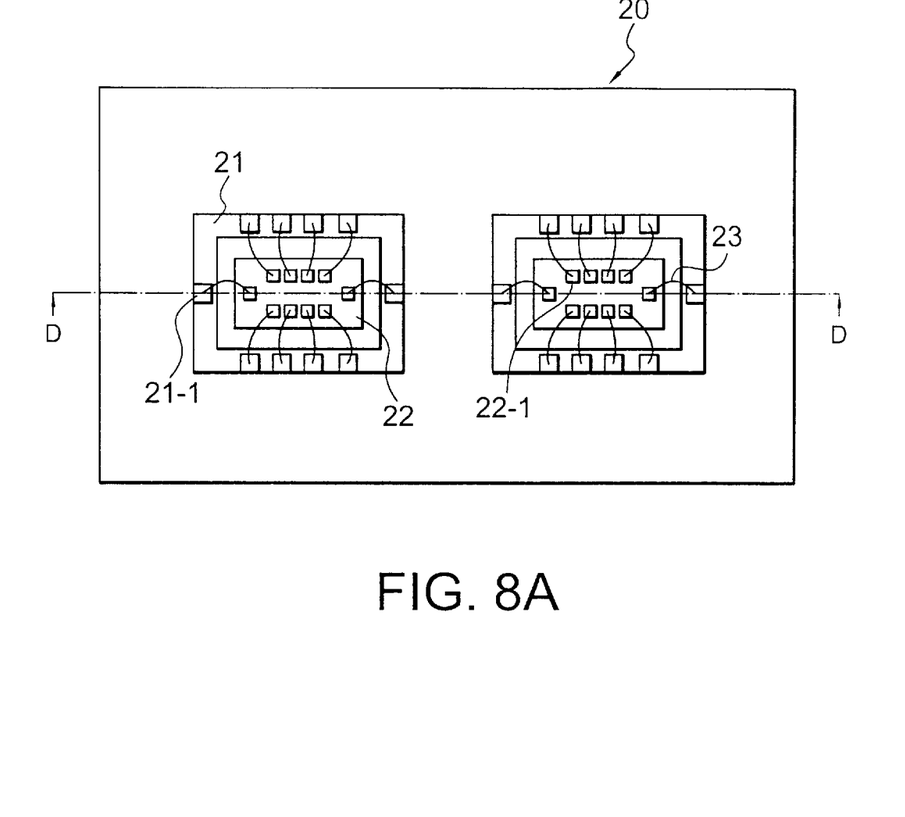
FIG. 8A is a top view of an example of a component mounted module according to the present invention.
Figure 8B:
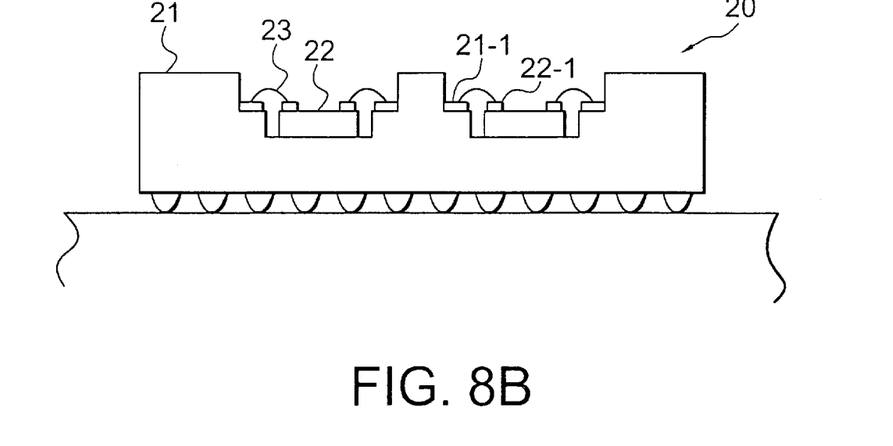
FIG. 8B is a cross section along D—D line in FIG. 8A.

FIGS. 8A and 8B are a top view and a cross section of an example after the component mounting step 13 described above. As illustrated, a high frequency multichip module 20 already includes the microstrip-type bare chip 22 and other components mounted on the substrate 21.

In the high frequency multichip module 20, each of the substrate electrodes 21-1 of the substrate 21 is connected to the corresponding chip electrode 22-1 of the microstrip-type bare chip 22 with a bonding metal wire 23.

Figure 9:
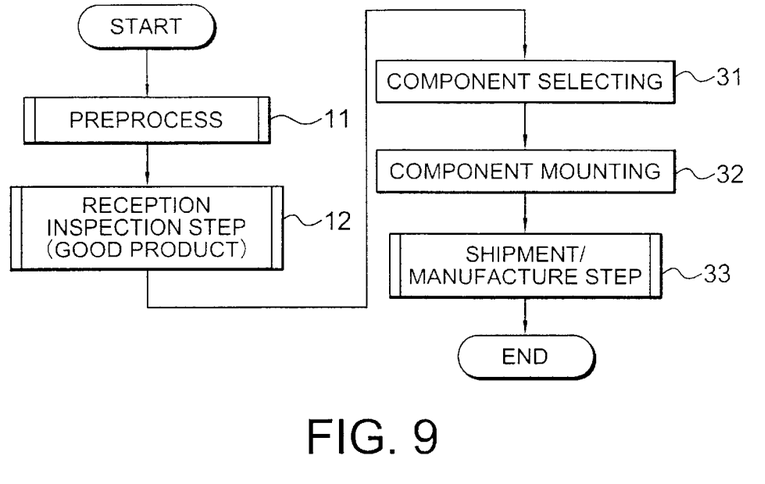
FIG. 9 is a detailed flow chart of an example of the component mounting step in FIG. 7.

Next, referring to FIG. 9 and additionally to FIGS. 8A and 8B, the component mounting step 13 continuing from the step 12 will be described in detail.

As illustrated, if a good product is obtained in the reception inspection step 12 of the high frequency bare chip, components such as resisters and capacitors that meet the external circuit constants are selected in a step of component selecting (step 31). As a result, desired circuit characteristics can be obtained when the good microstrip-type bare chip 22 is mounted on the substrate 21.

Next, the components selected in the step 31 and the good microstrip-type bare chip 22 are mounted on the substrate 21. And then, each of the substrate electrodes 21-1 of the substrate 21 is connected to the corresponding chip electrode 22-1 of the microstrip-type bare chip 22 with a metal bonding wire 23 as illustrated in FIGS. 8A and 8B, as a step of component mounting (step 32). As a result, the high frequency multichip module 20 is completed. The component mounted package may be shipped as a final product, or transferred to a manufacturing process of a product as a component used for the product as a step of shipment or manufacture (step 33).

Figure 10:
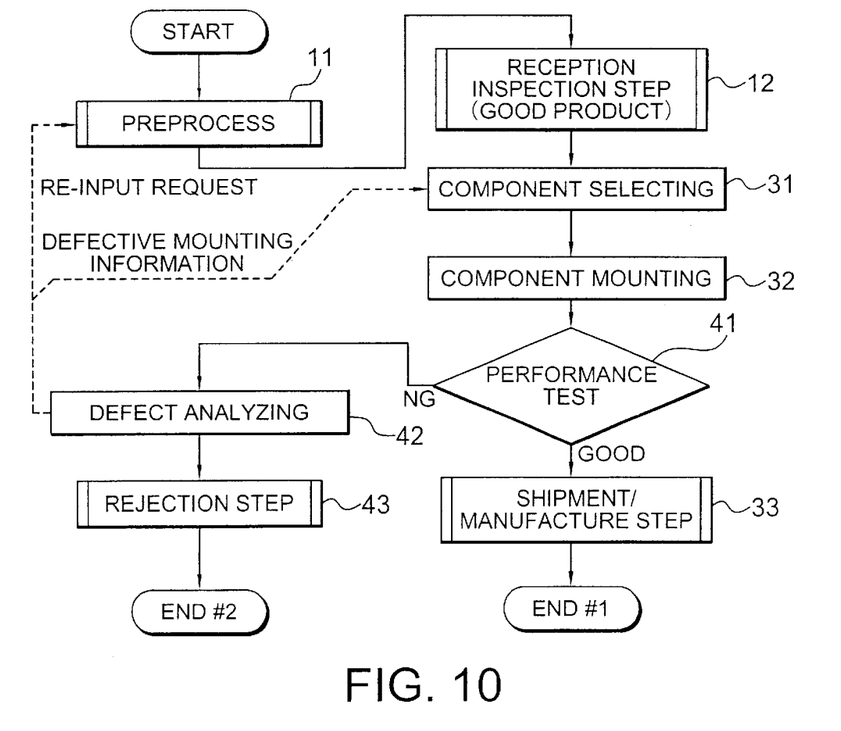
FIG. 10 is a flow chart of an example adding a performance test step to the process shown in FIG. 9.

FIG. 10 illustrates a flow chart of the case in which a step of a performance test (step 41) is inserted between the step 32 of component mounting and the last step 33 of shipment or manufacture.

In the step 41 of the performance test of the component mounted package, if the product is "GOOD", the process goes to the step 33. However, if the product is not good "NG", the defective product is analyzed in a step of defect analyzing (step 42). In accordance with the result of the analysis, the defective product is rejected in the rejection step 43 and the process is finished (End #2). A product may be determined to be defective due to, for example, a manufacturing failure such as breakage of the bare chip or substrate and failure of the wire bonding.

Such manufacturing failure is classified by the step 42 of the defective product analysis into two factors, i.e., failure of a mounting condition and breakage of a member. If the responsible factor is the failure of a mounting condition, the defective mounting information is fed back to step 31 of component selection. If the responsible factor is the breakage of a member, a re-input request is sent to the preprocess step 11.

Figure 11:
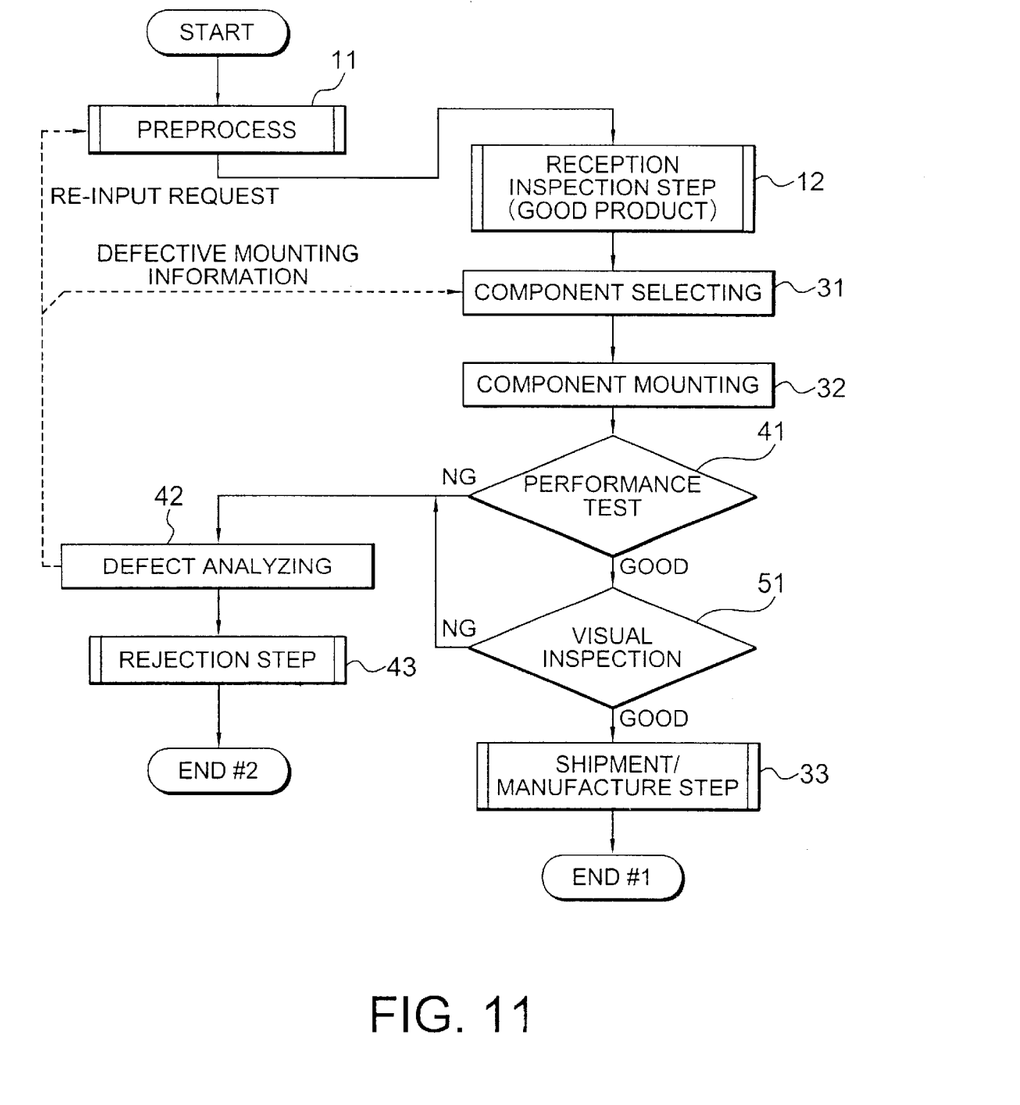
FIG. 11 is a flow chart of an example adding a visual inspection step to the process shown in FIG. 10.
Figure 12:
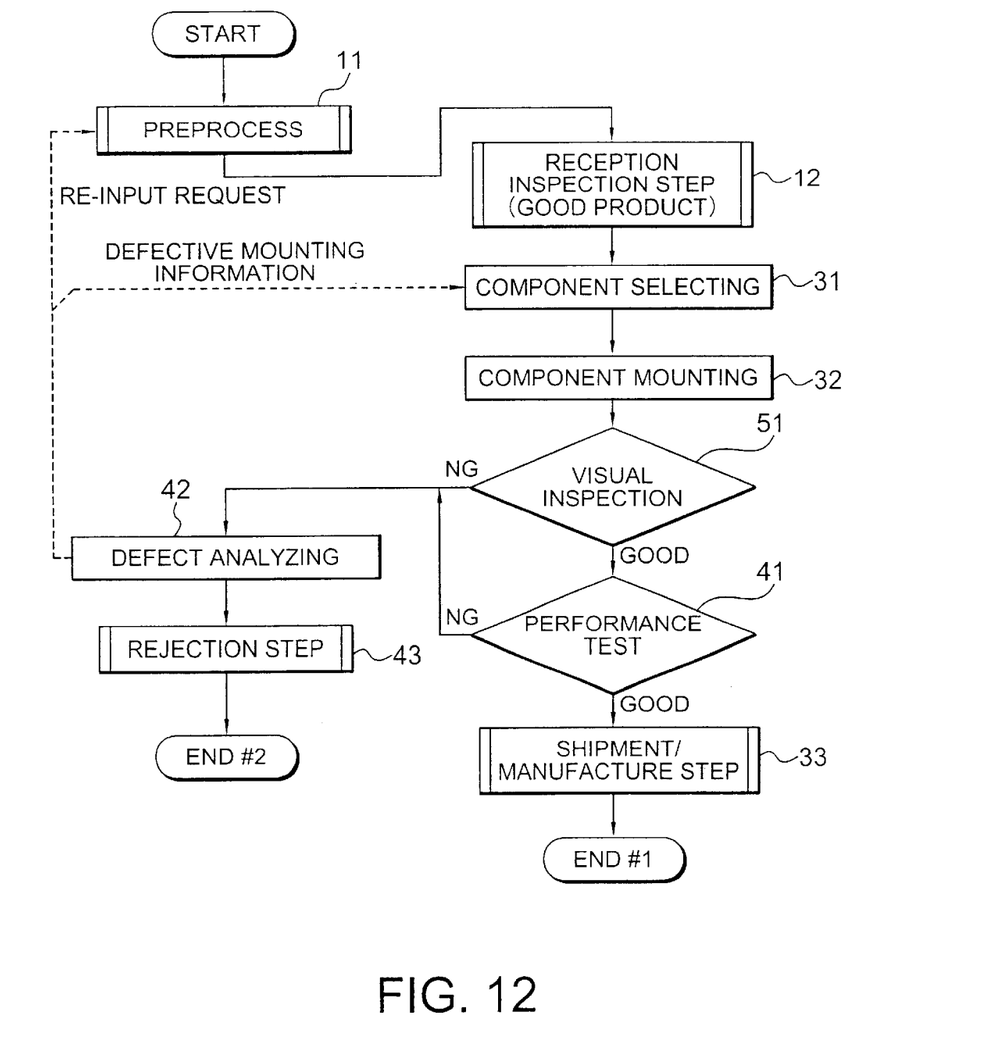
FIG. 12 is a flow chart of another example of the process shown in FIG. 11.

FIG. 11 illustrates a flow chart of the case in which a visual inspection step (step 51) is inserted after the step 41 of a performance test, before the step 33 of shipment or manufacture. However, FIG. 12 illustrates another flow chart in which the order of these two steps 41 and 51 are reversed from that illustrated in above FIG. 11. In this step 51 of visual inspection, a position shift between the mounted component of the external circuit and the microstrip-type bare chip, and the states of the wire bonding are inspected.

Figure 13A:
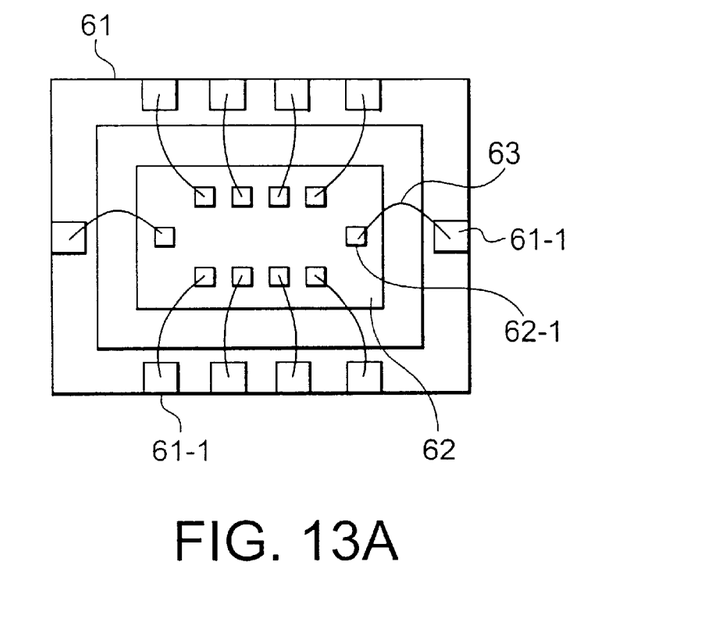
FIG. 13A is a top view of an example of the microstrip-type bare chip mounted on a substrate.
Figure 13B:
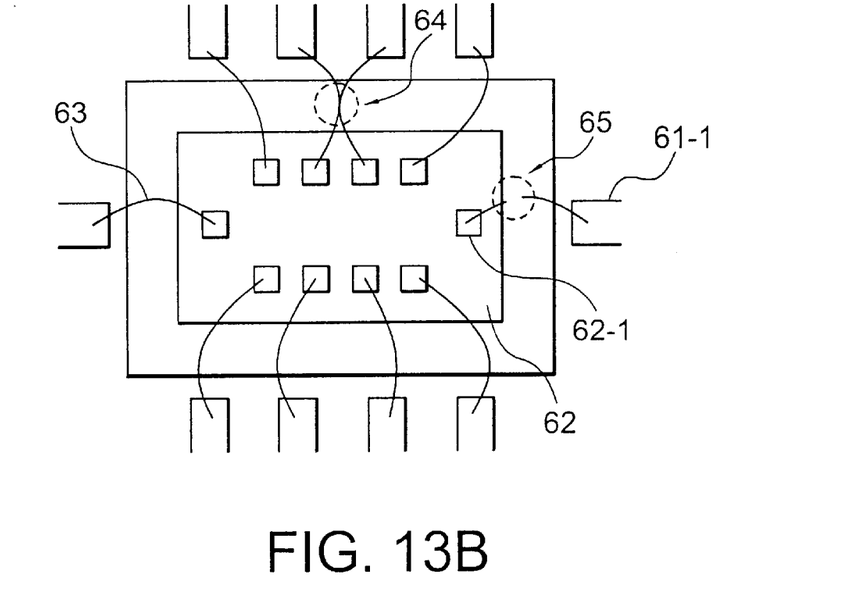
FIG. 13B is an enlarged partial view of FIG. 13A.

FIGS. 13A and 13B show the substrate 61 that carries the microstrip-type bare chip 62, and examples of failure in the visual inspection test. The highest probability causes of failure are a short circuit at the portion 64 and breakage at the portion 65 of the metal wires 63 that connect the substrate electrodes 61-1 with the signal electrodes 62-1.

As described above, since the highest probability causes of failure detected in the step 41 of a performance test illustrated in FIG. 10 can be confirmed by visual inspection, the step 41 of the performance test may be replaced by the step 51 of visual inspection illustrated in FIG. 11 or 12. However, it is preferable that both steps 41 and 51 are included in the manufacturing process since it is possible to have visible defects that do not influence the performance and performance failures that cannot be detected by visual inspection.

In the step 51 of visual inspection, in the same manner as in step 41, if the product is "GOOD" in the step 51, the process goes to the step 33. If the product is not good "NG" in step 51, the defective product is analyzed in step 42 and the defective product is rejected in the rejection step 43 to finish the process (End #2).

As described above, according to the present invention, high frequency characteristics of the microstrip-type bare chip can be measured by the vertical-type probe and the device stage, before the component mounting step upstream of manufacturing, so as to determine whether a microstrip-type bare chip is good or not good.

In addition, the constants of the components to be mounted for the external circuit can be selected in accordance with the result of the quality determination to mount the components on the substrate. Thus, desired characteristics of the high frequency multichip module can be obtained easily without adjusting or replacing the microstrip-type bare chip or the mounted components of the external circuit after assembly.

Therefore, the manufacturing process is not required to go in the backward direction, and the forward rate is improved so that the manufacturing time and cost can be reduced.

In addition, since the ground electrode is not required to be disposed at the front surface of the bare chip according to the manufacturing process of the present invention, the area of the bare chip can be reduced. Therefore, high-density mounting and small sizes for the same function can be realized. In addition, the cost reduction effect may be large when using an expensive wafer such as GaAs since more bare chips can be produced from the same sized wafer at one time.

What is claimed is:

1. A process for manufacturing a high frequency multichip module, in which a small bare chip can be tested independently, wherein the process comprises a reception inspection step including the steps of:

preparing a vertical-type probe that has a center conductor and ground conductors arranged at both sides of the tip portion of the center conductor in the vertical direction, which is the direction of pressing the probe to electrodes on the bare chip to be tested;

setting a high frequency bare chip on the upper surface of a device stage, the bare chip having a ground electrode disposed on a side opposite to a side having signal electrodes thereon; and measuring high frequency characteristics of the high frequency bare chip using the vertical-type probe after the setting step and before mounting the bare chip and selected components on a substrate.

2. A process for manufacturing a high frequency multichip module including a small high frequency bare chip having a ground electrode disposed on a side opposite to a side having signal electrodes, wherein the process comprises a reception inspection step before a component mounting step of mounting the bare chip on a substrate, and the reception inspection step includes the steps of:

setting the high frequency bare chip on a device stage;

probing, after the setting step, by using a vertical-type probe that has a center conductor and ground conductors arranged at both sides of the tip portion of the center conductor in the vertical direction to press the probe to the electrodes of the bare chip to be measured, such that the tip portion of the center conductor connects with the signal electrode while the tip portion of at least one of the ground conductors connects with the ground electrode of the high frequency bare chip with the shortest distance therebetween via the device stage, and making electrical contact with a power source electrode of the high frequency bare chip via means for electrically leading out the power source electrode;

supplying a predetermined voltage to the power source electrode after the probing step;

measuring the high frequency characteristics of the high frequency bare chip after the step of supplying the voltage; and designating the high frequency bare chip set on the device stage to a rank corresponding to a quality level in accordance with the result of the measurement obtained in the the measuring step.

3. The process according to claim 2, wherein the component mounting step further comprises the steps of:

selecting components to be mounted for an external circuit so that desired characteristics can be obtained when the high frequency bare chip is designated to be of a particular rank in the designating step; and mounting the selected components including the high frequency bare chip on the substrate.

4. The process according to claim 2, further comprising the step of testing high frequency characteristics of an assembled high frequency multichip module after the component mounting step.

5. The process according to claim 4, further comprising the step of analyzing a defective module if the characteristics obtained in the testing step are not among a range of desired characteristics, and feeding back a re-input request to a preprocess step before the reception inspection step in the event of a defective member, while feeding back defective mounting information in the event of defectively mounted components from the component mounting step.

6. The process according to claim 2, further comprising the step of performing visual inspection for checking the positions of the mounted components and the states of wire bonding connections after the component mounting step.

7. The process according to claim 6, further comprising the step of analyzing a defective portion if the appearance is not good in the visual inspection step, and feeding back a re-input request to a preprocess before the reception inspection step in the event of a defective member, while feeding back defective mounting information in the event of defectively mounted components from the component mounting step.

8. The process according to claim 2, further comprising the steps of:

testing high frequency characteristics of an assembled high frequency multichip module after the component mounting step; and performing visual inspection for checking the positions of the mounted components and the states of wire bonding connections after the step of testing high frequency characteristics, wherein the process proceeds to the next step upon passing both the testing step and the visual inspection step.

9. The process according to claim 2, further comprising the steps of:

performing visual inspection for checking the positions of the mounted components and the states of wire bonding connections after the component mounting step; and testing high frequency characteristics of an assembled high frequency multichip module after the step of performing visual inspection, wherein the process proceeds to the next step upon passing both the testing step and the visual inspection step.

* * * * *